United States Patent
Zhang et al.

(10) Patent No.: US 10,036,914 B2
(45) Date of Patent: Jul. 31, 2018

(54) HEAT DISSIPATER FOR A DISPLAY MODULE

(71) Applicant: Keewin Display Co., Ltd., Shanghai (CN)

(72) Inventors: Qianzhong Zhang, Shanghai (CN); Rubin Sun, Shanghai (CN); Rongjun Gu, Shanghai (CN)

(73) Assignee: Keewin Display Co., Ltd., Shanghai (CN)

( * ) Notice: Subject to any disclaimer, the term of this patent is extended or adjusted under 35 U.S.C. 154(b) by 0 days.

(21) Appl. No.: 15/112,093

(22) PCT Filed: Apr. 8, 2015

(86) PCT No.: PCT/CN2015/076036
§ 371 (c)(1),
(2) Date: Jul. 15, 2016

(87) PCT Pub. No.: WO2015/192679
PCT Pub. Date: Dec. 23, 2015

(65) Prior Publication Data
US 2017/0269423 A1    Sep. 21, 2017

(30) Foreign Application Priority Data

Jun. 18, 2014  (CN) .......................... 2014 1 0273054
Mar. 27, 2015  (CN) .......................... 2015 1 0137520

(51) Int. Cl.
*G02F 1/1335*  (2006.01)
*G02F 1/1333*  (2006.01)
*H05K 7/20*    (2006.01)

(52) U.S. Cl.
CPC .. *G02F 1/133385* (2013.01); *G02F 1/133308* (2013.01); *G02F 1/133504* (2013.01);
(Continued)

(58) Field of Classification Search
CPC ......... G02F 1/133308; G02F 1/133603; G02F 1/133608; G02F 1/133615; G02F 1/133385; G02F 1/1336; G02F 1/1333; G02F 1/133382; G02F 1/1335; G02F 1/133504; G02F 1/133602; G02F 2001/133314; G02F 2001/133317; G02F 2001/133628; G02F 2001/133331; G02F 2001/13332; G02F 2201/46; G02F 2201/36; G02F 2201/465;
(Continued)

(56) References Cited

U.S. PATENT DOCUMENTS

| | | | |
|---|---|---|---|
| 2007/0103908 A1* | 5/2007 | Tabito | G02F 1/133608 362/294 |
| 2009/0147170 A1* | 6/2009 | Oh | G02F 1/133308 349/58 |
| 2009/0153780 A1* | 6/2009 | Takata | G02F 1/13471 349/74 |

\* cited by examiner

*Primary Examiner* — Thoi Duong
(74) *Attorney, Agent, or Firm* — Wang Law Firm, Inc.

(57) ABSTRACT

A display module has therein a heat dissipater, an installation frame, a LCD plate, an optical membrane, a diffusion plate and a light board respectively and sequentially received inside the installation frame, a first space defined between the LCD panel and the optical membrane. A heat dissipater has a first inlet, a first outlet both of which are defined in the installation frame and form a first airway inside the first space and a screen respectively provided to the first inlet and the first outlet. The formation of the airway facilitates air convection inside the display module, which helps dissipate heat generated from the operation of the display module.

16 Claims, 2 Drawing Sheets

(52) U.S. Cl.
CPC ... *H05K 7/20972* (2013.01); *G02F 1/133603* (2013.01); *G02F 2001/133328* (2013.01); *G02F 2001/133331* (2013.01); *G02F 2001/133628* (2013.01); *G02F 2201/36* (2013.01); *G02F 2201/50* (2013.01)

(58) Field of Classification Search
CPC ... G02F 2201/50; H01L 33/64; G02B 6/0085; G02B 6/0088; G02B 6/0068; G02B 6/0073; G02B 6/0051; F21Y 2115/10; F21Y 2105/00; F21Y 2103/10; F21Y 2101/00; H04N 5/64; H04N 5/2252; H04N 5/2254; H04N 9/3144; F21V 29/70; F21V 29/503; F21V 15/01; H05K 5/0217; H05K 5/0204; H05K 2201/10106; H05K 2201/10136; H05K 7/20963; H05K 7/20972; G03B 21/16; G03B 21/2033; G03B 21/006; G03B 21/145
USPC .................................. 349/65, 58, 62, 64, 161
See application file for complete search history.

HEAT DISSIPATER FOR A DISPLAY MODULE

FIELD OF THE INVENTION

The invention is related to the technology of heat dissipater, and more particularly, to a heat dissipater for a display module to effectively dissipate heat generated during the operation of the display module.

BACKGROUND

There are two types of LCD display constructions, i.e., cell and open cell during the manufacture process of a display module. In the cell structure, liquid crystal is filled in the gap between two substrates and then the two substrates are sealed to form a module, whose appearance is the same as a normal piece of glass. After the prior process is completed, connection ports are provided to a cell-based display module for external signal, i.e., open-cell. However, a backlight module is not included in the display module so made.

A display module cannot illuminate by itself but through the backlight module. As result, the backlight module is crucial in the display industry. The backlight module is composed of a light source, a light guide, an optical membrane, a diffusion plate, a rubber strip and a backboard. A display module is formed when the backlight module and the LCD panel is combined. The overall consideration of this display module is mainly focused on lightweight, thin, low cost and high efficiency of heat dissipation.

One of the publications available, bearing the publication number 104020591 titled "DISPLAY MODULE AND INSTALLATION METHOD THEREOF" provides a new display structure having an installation frame which is composed of multiple installation strips and multiple function plates firmly received inside the installation frame by means of multiple installation devices provided on sides of the installation frame. As shown in FIGS. 1 and 2, the display module includes an installation frame 20 and multiple function plates 30. The installation frame 20 is composed of a plurality of installation strips 201 interconnected together and installation devices 205 provided on sides of the installation frame 20. Each of the installation device 205 includes installation grooves 208, 209 both defined in an inner side of the installation strip 201 and an installation face 207. A heat dissipation device 2012 is formed on each of the installation strips 201. And the function plate 30 includes a light board 302, a LCD panel 304, a diffusion board 306 and an optical membrane 308. The LCD panel 304 is firmly inserted in the installation grooves 208 of each of the installation strips 201, while the optical membrane 308 and the diffusion plate 306 are inserted in the installation grooves of each of the installation strips 201. The light board 302 is detachably mounted on the installation face 207. It is concluded from the above statement that the overall structure and arrangement effectively saves manufacture cost and adaption for size requirements is strong.

However, the structure of the stated display module above shows poor heat dissipation efficiency. Normally, the heat generated from the operation of the display module is dissipated through the heat dissipation devices on the installation strips. When the size of the display module is large and there are a lot more light sources provided to match the size requirement, the heat dissipation device formed on the installation strip no longer fulfills the need to dissipate heat effectively, which often causes malfunction to the display module. Nowadays, the commercially available technology used in heat dissipation includes the use of a fan to generate internal air circulation to facilitate the heat dissipation efficiency. However, due to high standard requirement to the air inside the display module to avoid influence of polluted air to the resolution of the display, it seems that using air convection to enhance the efficiency of heat dissipation is not very popular.

SUMMARY OF THE INVENTION

The primary objective of the embodiment(s) provided for the present invention is to overcome deficiencies in the current technology and provide a heat dissipater to solve the problem caused by the current heat conduction which can only dissipate heat locally and thus cause heat difference inside the display module.

In order the above problem, the technology used in the preferred embodiment of the present invention includes the following.

The primary objective of the preferred embodiment of the present invention is to provide a heat dissipater for a display module having therein a frame, a LCD panel, an optical membrane, a diffusion plate and a light board respectively and sequentially arranged inside the frame. A first space is defined between the LCD panel and the optical membrane. The heat dissipater includes a first inlet and a first outlet both defined in a periphery forming the frame and together forming a first channel inside the first space. A screen is provided to both the inlet and the outlet.

The adoption of the first inlet and the first outlet on the frame so as to form an air channel between the LCD panel and the diffusion plate such that air convection is able to dissipate heat generated from the inside of the display module effectively. Moreover, the addition of the screen ensures the purity of air flowing into the interior of the display module and prevents resolution of the LCD panel being influenced by polluted air.

Another objective of the preferred embodiment of the present invention is the location of the first inlet and the first outlet are respectively opposite relative to one another on the frame.

Still another objective of the preferred embodiment of the present invention is a second space is defined between the diffusion plate and the light board. The heat dissipater further includes a second inlet and a second outlet both defined in the periphery forming the frame. Both the second inlet and the second outlet form a second channel inside the second space. A second screen is respectively provided to the second inlet and the second outlet.

Still another objective of the preferred embodiment of the present invention is that locations of the second inlet and the second outlet are respectively opposite relative to one another on the frame.

A further objective of the preferred embodiment of the present invention is that a first air device is provided to a location where the first inlet and the second inlet are defined and a second air device is provided to a location where the second outlet and the second outlet are defined.

Still another objective of the preferred embodiment of the present invention is that the first air device includes a first fan whose one end is fixed on the frame and second end is provided with a screen.

Still another objective of the preferred embodiment of the present invention is that the second air device includes a second fan whose one end is fixed on the frame and second end is provided with a screen.

Still, an objective of the preferred embodiment of the present invention is that a protection glass is attached to a side of the LCD panel, which is remote from the first space.

Still, an objective of the preferred embodiment of the present invention is that the LCD panel and the protection glass are provided on an installation face of the frame and an outer periphery of the protection glass is fixed on the frame through pressing bars.

Still, an objective of the preferred embodiment of the present invention is that the light board has a heat dissipation plate securely attached to a back of the light board.

DETAILED DESCRIPTION OF THE PREFERRED EMBODIMENT

In combination of the accompanying drawings, the following description details the preferred embodiment(s) of the display module of the present invention.

A heat dissipater constructed in accordance with the preferred embodiment of the present invention adopts the theory of building an airway to generate air convection to fast dissipate heat, which is more efficient than the current art in the field of heat dissipation. The use of the first inlet and the first outlet to create an airway to dissipate the heat is a cure for the bias that air-cooling structure is not appropriate for the display module. Also, under the criteria that the air circulating inside the display module be clean, air convection inside the display module is the best resolution to solve problems caused by the accumulated heat inside the display module. In order to facilitate description and understanding, the following description is accompanied by drawings where appropriate.

Figure 1:
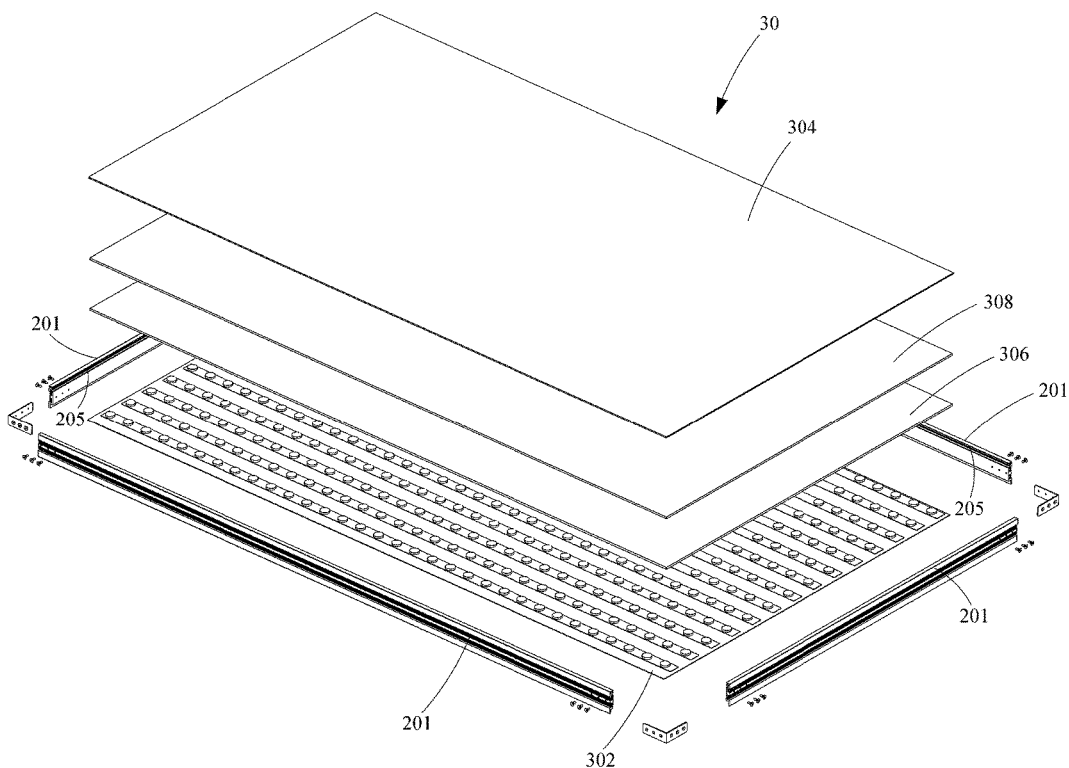
FIG. 1 is an exploded perspective view showing a display module constructed in accordance with the preferred embodiment of the present invention.
Figure 2:
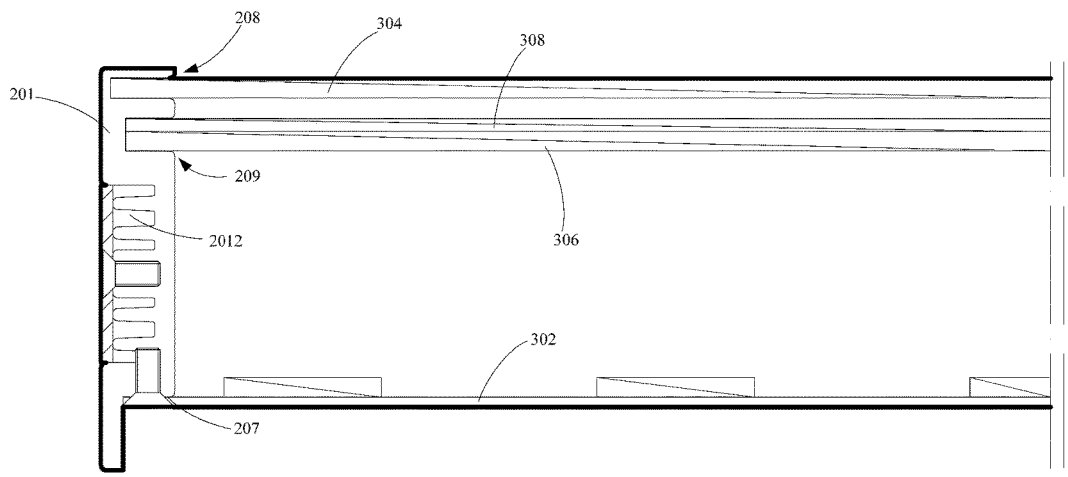
FIG. 2 is a schematic sectional view of the display module shown in FIG. 1 being assembled.
Figure 3:
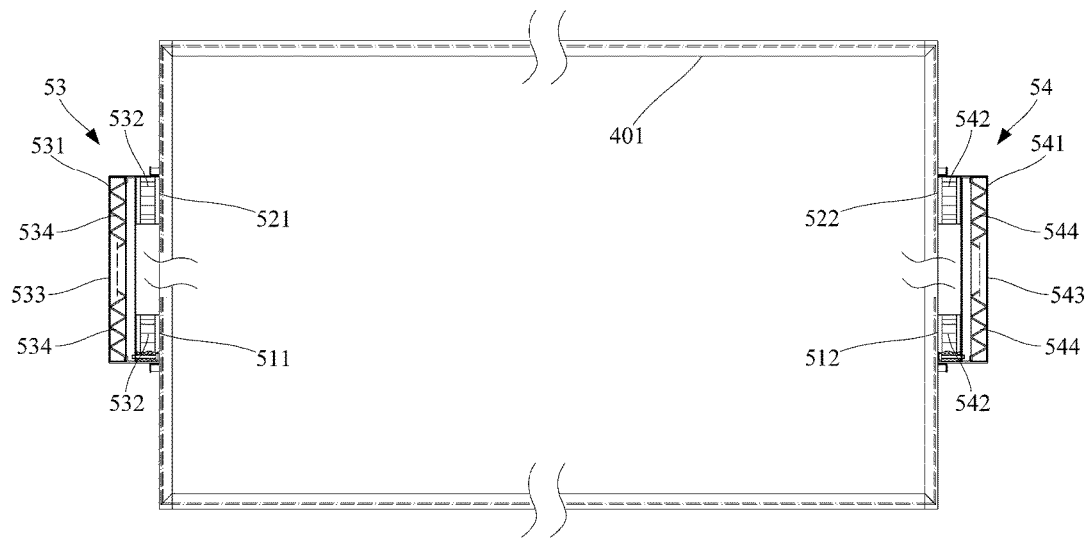
FIG. 3 is a schematic structural view of the display module of the present invention.
Figure 4:
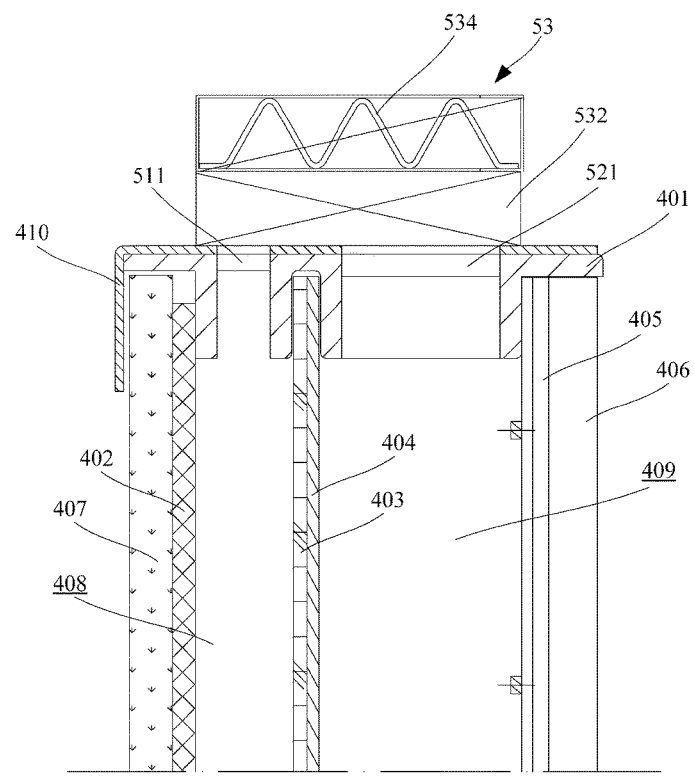
FIG. 4 is a schematic sectional view of the heat dissipater of the preferred embodiment of the present invention.

With reference to FIGS. 3 and 4, a preferred embodiment of the display module of the present invention is shown. It is to be appreciated that the display module includes a frame 401, a LCD panel 402, an optical membrane 403, a diffusion plate 404, and a light board 405 respectively fixed inside the frame 401. A first space 408 is defined between the LCD panel 402 and the optical membrane 403, while a second space 409 is defined between the diffusion plate 404 and the light board 405. The heat dissipater constructed in accordance with the preferred embodiment of the present invention includes a first inlet 511 and a first outlet 512 both defined in a periphery forming the frame 401. The first inlet 511 and the first outlet 512 together define a first airway inside the first space 408 to facilitate air convection inside the first space 408 to dissipate heat and both are provided with a screen to filter out pollutant such as dust, particles . . . etc. in the air.

The heat dissipater of the preferred embodiment of the present invention also includes a second inlet 521 and a second outlet 522 defined in the periphery forming the frame 401, together they both form a second airway inside the second space 409. A screen is also respectively provided to each of the second inlet 521 and the second outlet 522 to ensure the air quality. The second airway inside the second space 409 forms an air convection to facilitate heat dissipation.

As shown in FIG. 4, the frame 401 of the display module has an installation device with which the LCD panel 402, the optical membrane 403, the diffusion plate 404 and the light board 405 are installed on the frame 401. A top installation face is formed on top of the frame 401 for the LCD panel 402 and an installation groove is defined in a middle portion of the frame 401 for the installation of the optical membrane 403 and the diffusion plate 404. A bottom installation face is formed at the bottom of the frame 401 for the light board 405. When the display module is in use, normally the LCD panel 402 is not directly exposed to the air and thus a protection glass 407 is attached to the LCD panel's 402. The protection glass 407 and the LCD panel 402 are integrally installed on the installation face of the frame 401 through a pressing bar 410. The pressing bar 410 is L shaped whose first free end is securely attached to an outer face of the protection glass 407 and second free end is securely attached to an outer periphery of the frame 401. In addition, location of the first free end of the pressing bar 410 corresponds to location of the first inlet 511, the first outlet 512, the second inlet 521 and the second outlet 522. The optical membrane 403 and the diffusion plate 404 are securely attached to one another and inserted into the installation groove of the frame 401. In order to increase the heat dissipation efficiency, a heat dissipation plate 406 is attached to a back of the light board 405.

The first space 408 is defined between the LCD panel 402 and the optical plate 403. The second space 409 is defined between the light board 404 and the light board 405. Light coming from the light board 405 passes the second space 409 and reaches the diffusion board 404. After passing through the diffusion board 404 and the optical membrane 403, the light continues to travel and passes the first space 408 and arrives at the LCD panel 402. If particles exist in the first space 408 and light passes the first space 408, there will be reflection and/or scattering effect, which seriously affects the display effect. As a result, when the first space 408 is sealed, the air quality therein should be kept clean and pure.

With reference to FIG. 3, it is appreciated that the first airway includes the first inlet 511 and the first outlet 512 both of which are defined in the frame 401. Preferably, the location of the first inlet 511 is opposite to that of the first outlet 512 on the frame 401. The second airway includes the second inlet 521 and the second outlet 522 both of which are defined in the frame 401. Preferably, location of the second inlet 521 is opposite to that of the second outlet 522 on the frame 401.

Preferably, a screen is provided respectively to each of the first inlet 511, the first outlet 512, the second inlet 521 and the second outlet 522.

Preferably, the heat dissipater of the preferred embodiment of the present invention also includes a first air device 53 provided at where the first inlet 511 and the second inlet 521 are defined and a second air device 53 located at where the first outlet 512 and the second outlet 522 are defined. With the assistance of the first air device 53 and the second air device 54, airways are respectively formed inside the first space 408 and the second space 409 to facilitate air convection inside the display module, which enhances heat dissipation effect to both the first space 408 and the second space 409.

Preferably, the first air device 53 includes a first fan 532 whose one end is fixed on the frame 401 and second end is provided with a screen 534. A first installation frame 531 is provided to the first air device 53 to enhance the first fan 532 to be installed on the frame 401. The first installation frame 531 has a first opening 533 and a screen 534 is provided to the first opening 533.

The second air device 54 includes a second fan 542 whose one end is fixed on the frame 501 and the other end is provided with a screen 544 to ensure the air quality coming to the inside of the display module. A second installation frame 541 is provided to the first air device 54 to enhance the second fan 542 to be installed on the frame 401. The second installation frame 541 has a second opening 543 and a screen 544 is provided to the second opening 543. Preferably, the first fan 532 blows air coming from the screen to the inside of the display module and the second fan 542 blows air inside the display module out of the display module, which forms an air convection both in the first space 408 and the second space 409 and still maintains air purity coming into the display module.

In sum, it is learned the adoption of the first inlet and the first outlet enables the formation of an airway between the LCD panel and the diffusion plate, which facilitates the heat dissipation efficiency inside the display module. Also, because of the provision of the screen, the air coming into the inside of the display module is guaranteed to avoid any contamination to the display effect.

What is claimed is:

1. In a display module having therein a heat dissipater, an installation frame, a LCD plate, an optical membrane, a diffusion plate and a light board respectively and sequentially received inside the installation frame, a first space being defined between the LCD panel and the optical membrane, characterized in that: the heat dissipater consists essentially of a first inlet, a first outlet both of which are defined in the installation frame and form a first airway inside the first space and a screen respectively provided to the first inlet and the first outlet;
    a second space is defined between the diffusion plate and the light board, the heat dissipater further consists essentially of a second inlet, a second outlet both of which are defined in the installation frame and form a second airway inside the second space and a second screen respectively provided to the second inlet and the second outlet.

2. The display module as claimed in claim 1, characterized in that location of the first inlet is opposite relative to that of the first outlet on the installation frame.

3. The display module as claimed in claim 2, characterized in that location of the second inlet is opposite relative to that of the second outlet on the installation frame.

4. The display module as claimed in claim 3, characterized in that the heat dissipater further consists essentially of a first air device provided on the installation frame and near where the first inlet and the first outlet are defined and a second air device provided on the installation frame and near where the second inlet and the second outlet are defined.

5. The display module as claimed in claim 4, characterized in that the first air device includes a first fan whose first free end is securely attached to the installation frame and second end is provided with a screen.

6. The display module as claimed in claim 4, characterized in that the second air device includes a second fan whose first free end is securely attached to the installation frame and second end is provided with a screen.

7. The display module as claimed in claim 1, characterized in that a protection glass is securely attached to a LCD panel's side remote from the first space.

8. The display module as claimed in claim 7, characterized in that a pressing bar is provided to ensure that the protection glass is securely attached to the installation frame.

9. The display module as claimed in claim 1, characterized in that a heat dissipation plate is provided to a back of the light board.

10. In a display module having therein a heat dissipater, an installation frame, a LCD plate, an optical membrane, a diffusion plate and a light board respectively and sequentially received inside the installation frame, a first space being defined between the LCD panel and the optical membrane, characterized in that: the heat dissipater consists essentially of a first inlet, a first outlet both of which are defined in the installation frame and form a first airway inside the first space and a screen respectively provided to the first inlet and the first outlet,
    a heat dissipation plate is provided to a back of the light board,
    wherein location of the first inlet is opposite relative to that of the first outlet on the installation frame, and
    a second space is defined between the diffusion plate and the light board, the heat dissipater further comprises essentially of a second inlet, a second outlet both of which are defined in the installation frame and form a second airway inside the second space and a second screen respectively provided to the second inlet and the second outlet.

11. The display module as claimed in claim 10, characterized in that location of the second inlet is opposite relative to that of the second outlet on the installation frame.

12. The display module as claimed in claim 11, characterized in that the heat dissipater further consists essentially of a first air device provided on the installation frame and near where the first inlet and the first outlet are defined and a second air device provided on the installation frame and near where the second inlet and the second outlet are defined.

13. The display module as claimed in claim 12, characterized in that the first air device includes a first fan whose first free end is securely attached to the installation frame and second end is provided with a screen.

14. The display module as claimed in claim 12, characterized in that the second air device includes a second fan whose first free end is securely attached to the installation frame and second end is provided with a screen.

15. The display module as claimed in claim 10, characterized in that a protection glass is securely attached to a LCD panel's side remote from the first space.

16. The display module as claimed in claim 15, characterized in that a pressing bar is provided to ensure that the protection glass is securely attached to the installation frame.

* * * * *